(12) United States Patent
Hwang et al.

(10) Patent No.: US 9,343,640 B2
(45) Date of Patent: *May 17, 2016

(54) LIGHT EMITTING DEVICE, LIGHT EMITTING DEVICE PACKAGE AND LIGHTING SYSTEM INCLUDING THE SAME

(71) Applicant: LG Innotek Co., Ltd., Seoul (KR)

(72) Inventors: Sung Min Hwang, Anyang-si (KR); Hyun Don Song, Incheon (KR); Hyun Kyong Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/535,122

(22) Filed: Nov. 6, 2014

(65) Prior Publication Data

US 2015/0060927 A1 Mar. 5, 2015

Related U.S. Application Data

(63) Continuation of application No. 13/963,877, filed on Aug. 9, 2013, now Pat. No. 8,907,363, which is a continuation of application No. 13/526,411, filed on Jun. 18, 2012, now Pat. No. 8,513,681, which is a continuation of application No. 12/772,985, filed on May 3, 2010, now Pat. No. 8,222,661.

(30) Foreign Application Priority Data

May 4, 2009 (KR) ........................ 10-2009-0039015

(51) Int. Cl.
*H01L 33/60* (2010.01)
*H01L 33/14* (2010.01)
(Continued)

(52) U.S. Cl.
CPC ............ *H01L 33/60* (2013.01); *H01L 33/0033* (2013.01); *H01L 33/145* (2013.01); *H01L 33/48* (2013.01); *H01L 33/62* (2013.01); *H01L 33/40* (2013.01); *H01L 33/405* (2013.01); *H01L 33/42* (2013.01); *H01L 2224/48091* (2013.01); *H01L 2924/12032* (2013.01); *H01L 2933/0016* (2013.01)

(58) Field of Classification Search
CPC ... H01L 33/0033; H01L 33/145; H01L 33/60; H01L 33/405
See application file for complete search history.

(56) References Cited

U.S. PATENT DOCUMENTS 6,492,661 B1 12/2002 Chien et al.
6,744,071 B2 6/2004 Sano et al.
(Continued)

FOREIGN PATENT DOCUMENTS

CN 101132040 A 2/2008
EP 2 280 426 A2 2/2011
(Continued)

*Primary Examiner* — Jose R Diaz
(74) *Attorney, Agent, or Firm* — Birch, Stewart, Kolasch & Birch, LLP

(57) ABSTRACT

A light emitting device is described, including a second conductive type semiconductor layer; an active layer over the second conductive type semiconductor layer; a first conductive type semiconductor layer over the active layer; a second electrode in a first region under the second conductive type semiconductor layer; a current blocking layer including a metal; and a first electrode over the first conductive type semiconductor layer. Further, the first electrode has at least one portion that vertically overlaps the current blocking layer.

12 Claims, 8 Drawing Sheets

(51) Int. Cl.
*H01L 33/48* (2010.01)
*H01L 33/00* (2010.01)
*H01L 33/62* (2010.01)
*H01L 33/40* (2010.01)
*H01L 33/42* (2010.01)

(56) References Cited

U.S. PATENT DOCUMENTS

| | | |
|---|---|---|
| 6,838,704 B2 | 1/2005 | Lin et al. |
| 8,222,661 B2 | 7/2012 | Hwang et al. |
| 2004/0135166 A1 | 7/2004 | Yamada et al. |
| 2006/0163599 A1 | 7/2006 | Tsai et al. |
| 2007/0114545 A1 | 5/2007 | Jang et al. |
| 2007/0278508 A1 | 12/2007 | Baur et al. |
| 2007/0290215 A1 | 12/2007 | Kato et al. |
| 2008/0048206 A1 | 2/2008 | Lee et al. |
| 2008/0093619 A1 | 4/2008 | Konno et al. |
| 2008/0217635 A1 | 9/2008 | Emerson et al. |
| 2008/0308829 A1 | 12/2008 | Liu et al. |
| 2010/0032701 A1 | 2/2010 | Fudeta |
| 2011/0168971 A1 | 7/2011 | Song |
| 2014/0008610 A1 | 1/2014 | Takao et al. |

FOREIGN PATENT DOCUMENTS

| | | |
|---|---|---|
| JP | 2001-144321 A | 5/2001 |
| JP | 2002-151733 A | 5/2002 |
| JP | 2003-046119 A | 2/2003 |
| JP | 2008-053685 A | 3/2008 |
| JP | 2008-294482 A | 12/2008 |
| JP | 4985067 B2 | 5/2012 |
| JP | 5032130 B2 | 7/2012 |
| JP | 5346443 B2 | 8/2013 |
| KR | 10-0721147 B1 | 5/2007 |
| KR | 10-0752696 B1 | 8/2007 |
| KR | 10-0876737 B1 | 8/2007 |
| KR | 10-2009-0027329 A | 3/2009 |
| WO | WO 2007/036164 A1 | 4/2007 |

LIGHT EMITTING DEVICE, LIGHT EMITTING DEVICE PACKAGE AND LIGHTING SYSTEM INCLUDING THE SAME

CROSS-REFERENCE TO A RELATED APPLICATIONS

This application is a Continuation of co-pending U.S. application Ser. No. 13/963,877 filed on Aug. 9, 2013, which is a Continuation of U.S. application Ser. No. 13/526,411 (now U.S. Pat. No. 8,513,681) filed on Jun. 18, 2012, which is a continuation of U.S. application Ser. No. 12/772,985 (now U.S. Pat. No. 8,222,661) filed on May 3, 2010, claiming the benefit of Korean Patent Application No. 10-2009-0039015 filed May 4, 2009, all of which are hereby incorporated by reference for all purposes as if fully set forth herein.

BACKGROUND OF THE INVENTION

1. Field of the Invention

Embodiments of the present invention relate to a light emitting device, a light emitting device package, and a lighting system including a current blocking layer.

2. Description of Related Art

Light emitting devices (LEDs) are semiconductor devices configured to convert a current into light. In addition, various LEDs including green LEDs are being used as light sources in electronic devices such as communication devices. For example, nitride semiconductors have a high thermal stability and wide band gaps, and are combined with other elements such as In and Al to form semiconductor layers for emitting green, blue and white light.

In addition, because it is easy to adjust wavelengths emitted from nitride semiconductors, nitride semiconductors are used in high power electronic devices including LEDs. Further, a light emitting structure includes a second conductive type semiconductor layer, an active layer, and a first conductive type semiconductor layer. In a vertical type light emitting device, a second electrode applying power to the first conductive type semiconductor layer is vertically disposed, and electrons and holes injected to respective electrodes flow into the active layer and are coupled to generate light.

The generated light is then emitted outward. However, a portion of light is absorbed into the electrodes at both ends, or disappears in the light emitting device, and thus is not emitted outwards. In more detail, the light emitted under an n type electrode region is reflected by an n type electrode, and is absorbed into the device. The absorbed light also generates heat in the light emitting device, which negatively affects the service life and reliability of the light emitting device.

SUMMARY OF THE INVENTION

Accordingly, one object of the present invention is to address the above-noted and other problems.

Another object of the present invention is to provide a light emitting device that has a high light emitting efficiency by forming a current blocking layer not affected by a heat treating process and a material diffusion of a reflective layer, a light emitting device package, and a lighting system.

To achieve these and other advantages and in accordance with the purpose of the present invention, as embodied and broadly described herein, the present invention provides in one aspect a light emitting device including a second conductive type semiconductor layer; an active layer over the second conductive type semiconductor layer; a first conductive type semiconductor layer over the active layer; a second electrode in a first region under the second conductive type semiconductor layer; a current blocking layer including a metal; and a first electrode over the first conductive type semiconductor layer. Further, the first electrode has at least one portion that vertically overlaps the current blocking layer.

In another aspect, the present invention provides a light emitting device including a second conductive type semiconductor layer; an active layer over the second conductive type semiconductor layer; a first conductive type semiconductor layer over the active layer; a second electrode in a first region under the second conductive type semiconductor layer; a schottky contact layer; and a first electrode over the first conductive type semiconductor layer.

In still another aspect, the present invention provides a light emitting device including a second conductive type semiconductor layer; an active layer over the second conductive type semiconductor layer; a first conductive type semiconductor layer over the active layer; a second electrode including a reflective layer in a first region under the second conductive type semiconductor layer; a current blocking layer on the second electrode layer and not overlapping the reflective layer; and a first electrode over the first conductive type semiconductor layer.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Hereinafter, a light emitting device, a light emitting device package, and a lighting system will be described with reference to accompanying drawings according to embodiments of the present invention.

In the descriptions of embodiments, when a layer (or film) is referred to as being 'on' another layer or substrate, it can be directly on another layer or substrate, or intervening layers may also be present. Further, when a layer is referred to as being 'under' another layer, it can be directly under another layer, and one or more intervening layers may also be present. In addition, when a layer is referred to as being 'between' two layers, it can be the only layer between the two layers, or one or more intervening layers may also be present.

Figure 1:
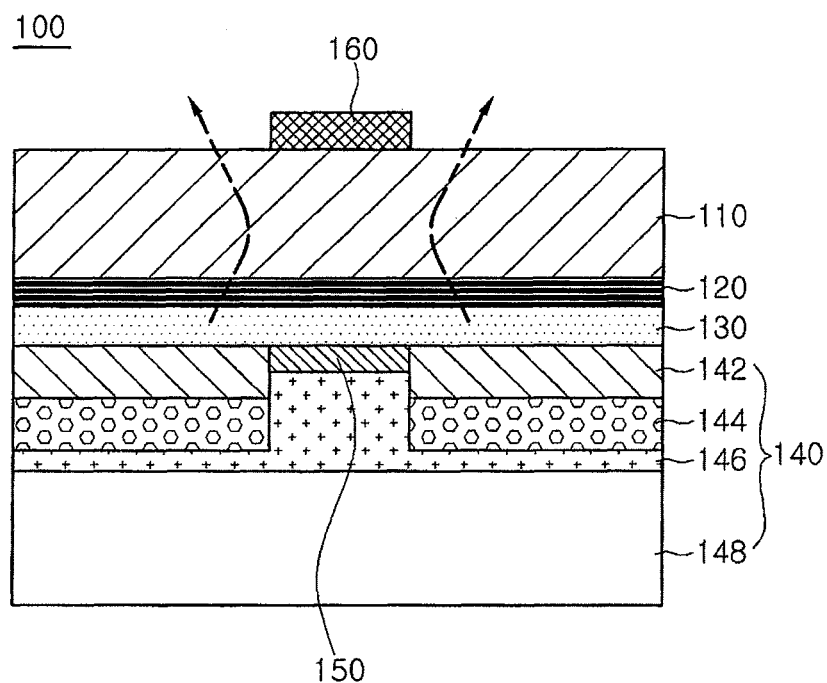
FIG. 1 is a cross-sectional view of a light emitting device (LED) according to an embodiment of the present invention.

FIG. 1 is a cross-sectional view of a light emitting device (LED) 100 according to an embodiment of the present invention. As shown, the light emitting device 100 includes a second conductive type semiconductor layer 130, an active layer 120, a first conductive type semiconductor layer 110, an ohmic layer 142 disposed in a first region on the second conductive type semiconductor layer 130, a reflective layer 144, a current blocking layer 150 disposed in a second region except for the first region on the second conductive type semiconductor layer 130, and a first electrode 160 disposed on the first conductive type semiconductor layer 110.

In this embodiment, the light emitting device 100 also includes an adhesive layer 146 disposed on the reflective layer 144 and the current blocking layer 150, a substrate 148, and a first electrode 160 on the first semiconductor layer 110. Further, a second electrode 140 can include the ohmic layer 142, the reflective layer 144, the adhesive layer 146, and the substrate 148. The second electrode layer 140 can also include at least one of the ohmic layer 142, the reflective layer 144, the adhesive layer 146, and the second substrate 148. For example, the second electrode layer 140 may include only both the ohmic layer 142 and the reflective layer 144.

In the light emitting device according to the current embodiment and a method of manufacturing the light emitting device, a process of forming the current blocking layer 150 is separated from a heat treating process of the ohmic layer 142 and the reflective layer 144 to form a current blocking layer that is not affected by the heat treating process and material diffusion of the reflective layer 144, thus providing a light emitting device having a high light emitting efficiency.

Further, in the current embodiment, the current blocking layer 150 is formed, which uses a Schottky contact through a non-ohmic metal to prevent a current from flowing into the second conductive type semiconductor layer 130 below the region of the first electrode 160. Thus, because the current blocking layer is not affected by the heat treating process for forming the ohmic layer and the diffusion of the material of the reflective layer, the light emitting device has a high light emitting efficiency.

That is, according to the current embodiment, the ohmic layer 142 and the reflective layer 144 that deform the current blocking layer 150 are separated from the current blocking layer 150 to dispose the ohmic layer 142 and the reflective layer 144 out of the region that is disposed under the region of the first electrode 160 on the current blocking layer 150.

The current blocking layer 150 is also formed of a metal than can form a Schottky contact with the second conductive type semiconductor layer 130. For example, the current blocking layer 150 may be formed of at least one of titanium (Ti), zirconium (Zr), chrome (Cr), gold (Au), tungsten (W), and/or an alloy including at least one of titanium (Ti), zirconium (Zr), chrome (Cr), gold (Au), and/or tungsten (W).

The current blocking layer 150 may also vertically overlap the first electrode 160. Further, the ohmic layer 142 is in ohmic contact with the second conductive type semiconductor layer 130 in the region out of the current blocking layer 150. Thus, as depicted by dashed lines of FIG. 1, current flowing from the second electrode layer 140 to the first electrode 160 substantially does not flow through the region where the current blocking layer 150 is disposed, but principally flows from the region out of the current blocking layer 150 to the first electrode 160.

Accordingly, in the current embodiment, a current is substantially not injected to the lower side of the region of the first electrode 160 to suppress the generation of light from the active layer 120 under the first electrode 160, thus preventing heat from being generating from the device by the absorption of light generated under the first electrode 160. Thus, in the light emitting device according to the current embodiment, because the current blocking layer 150 having Schottky barrier characteristics vertically overlaps the first electrode 160, a current flowing from the second electrode layer 140 to the first electrode 160 is prevented from intensively flowing to the lower side of the first electrode 160, and flows through the wide regions of the second conductive type semiconductor layer 130, the active layer 120, and the first conductive type semiconductor layer 110.

As a result, a current is prevented from intensively flowing to the lower side of the first electrode 160, and thus, the light emitting device can be driven at a stable operation voltage. In addition, when a current intensively flows to the lower side of the first electrode 160, light is principally generated from the active layer 120 at the lower side of the first electrode 160. In this instance, the possibility that light generated from the lower side of the first electrode 160 is absorbed by the first electrode 160 to reduce light intensity or disappears in the light emitting device is high.

However, in the light emitting device according to the current embodiment, current flows from the region of the second electrode layer 140, which does not vertically overlap the first electrode 160, to the first electrode 160. Thus, a larger amount of light is generated from the region of the active layer 120, which does not vertically overlap the first electrode 160 than from the region of the active layer 120, which vertically overlaps the first electrode 160.

The possibility that light generated from the region of the active layer 120, which does not vertically overlap the first electrode 160, is absorbed by the first electrode 160 to reduce the light intensity or disappears in the light emitting device is low. Thus, the optical efficiency of the light emitting device according to the current embodiment is increased.

First Embodiment

Figure 2:
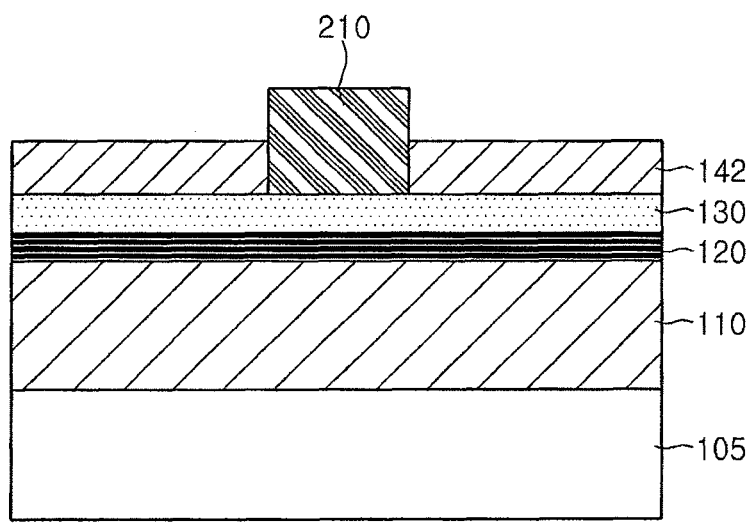
FIGS. 2 to 6 are cross-sectional views illustrating a method of manufacturing a light emitting device according to a first embodiment of the present invention.
Figure 3:
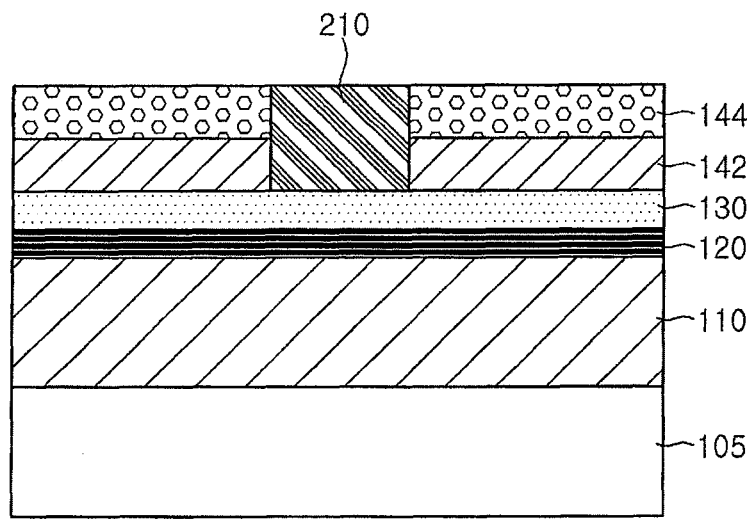

Hereinafter, a method of manufacturing a light emitting device according to the first embodiment of the present invention will now be described with reference to FIGS. 2 to 6. In FIG. 2, an un-doped GaN layer, the first conductive type semiconductor layer 110, the active layer 120, and the second conductive type semiconductor layer 130 are formed on a first substrate 105. A buffer layer may also be formed between the first substrate 105 and the un-doped GaN layer.

The first substrate 105 may also be formed of at least one of sapphire ($Al_2O_3$), Si, SiC, GaAs, ZnO, and/or MgO. Further, the buffer layer may be formed as a multi-layer having a stacked structure such as AlInN/GaN, $InxGa_{1-x}$N/GaN, and $Al_xIn_yGa_{1-x-y}$N/$In_xGa_{1-x}$N/GaN. For example, the buffer layer may be grown by injecting trimethylgallium (TMGa), trimethylindium (TMIn), trimethylalluminum (TMAl), hydrogen gas, and ammonia gas into a chamber.

The un-doped GaN layer may also be grown by injecting trimethylgallium (TMGa), hydrogen gas, and ammonia gas into the chamber. In addition, the first conductive type semiconductor layer 110 may be a nitride semiconductor layer to which first conductive type semiconductor ions are implanted, for example, and may be a semiconductor layer into which N type impurity ions are implanted. The first conductive type semiconductor layer 110 may also be grown by injecting trimethylgallium (TMGa), silane ($SiN_4$) gas including an N type impurity (e.g., Si), hydrogen gas, and ammonia gas into the chamber.

Further, the active layer 120 and the second conductive type semiconductor layer 130 are formed on the first conductive type semiconductor layer 110. Also, the active layer 120 may be formed in at least one of a single quantum well structure, a multi quantum well (MQW) structure, a quantum-wire structure, and a quantum dot structure. For example, trimethylgallium (TMGa) gas, ammonia ($NH_3$) gas, nitrogen ($N_2$) gas, and trimethylindium (TMIn) gas may be injected to the active layer 120 to form a multi quantum well structgur, but the present disclosure is not limited thereto.

The active layer 120 may also be formed of at least one of InGaN/GaN, InGaN/InGaN, AlGaN/GaN, InAlGaN/GaN, GaAs,/AlGaAs(InGaAs), and GaP/AlGaP(InGaP). In addition, the second conductive type semiconductor layer 130 may be a nitride semiconductor layer to which second conductive type semiconductor ions are implanted, for example, may be a semiconductor layer into which P type impurity ions are implanted. The second conductive type semiconductor layer 130 may also be grown by injecting trimethylgallium (TMGa), bis-ethyl-cyclopentadienyl-magnesium ($EtCp_2Mg$) {$Mg(C_2H_5C_5H_4)_2$} including a P type impurity (e.g., Mg), hydrogen gas, and ammonia gas into the chamber.

Thereafter, as shown in FIG. 2, a first pattern 210 is formed in the second region on the second conductive type semiconductor layer 130. In more detail, the first pattern 210 is used to selectively form the current blocking layer 150 on the second conductive type semiconductor layer 130. The first pattern 210 may also be formed as a layer such as a dielectric or a photosensitive layer.

Thereafter, the ohmic layer 142 is formed in the first region on the second conductive type semiconductor layer 130. In addition, the first region may be a portion of the upper surface of the second conductive type semiconductor layer 130 except for the second region provided with the first pattern 210. For example, the ohmic layer 142 may be formed by stacking a material such as a single metal, a metal alloy, or a metal oxide in multi layers to effectively inject holes. For example, the ohmic layer 142 may include at least one of ITO, IZO(In—ZnO), GZO(Ga—ZnO), AZO(Al—ZnO), AGZO(Al—GaZnO), IGZO(In—GaZnO), IrOx, RuOx, RuOx/ITO, Ni/IrOx/Au, Ni/IrOx/Au/ITO, Ni, Pt, Cr, Ti, and/or Ag, but the present disclosure is not limited thereto.

In the current embodiment, the ohmic layer 142 is lower than the first pattern 210, but the present disclosure is not limited thereto. Next, referring to FIG. 3, the reflective layer 144 is formed on the ohmic layer 142. For example, the reflective layer 144 may be formed as a metal layer including Al, Ag, or APC alloy (alloy including Ag, Pd, and Cu). A material such as aluminum or silver effectively reflects light generated from an active layer to significantly improve extraction efficiency of a light emitting device. At this point, the reflective layer 144 has the same level as that of the first pattern 210, but is not limited thereto.

Figure 4:
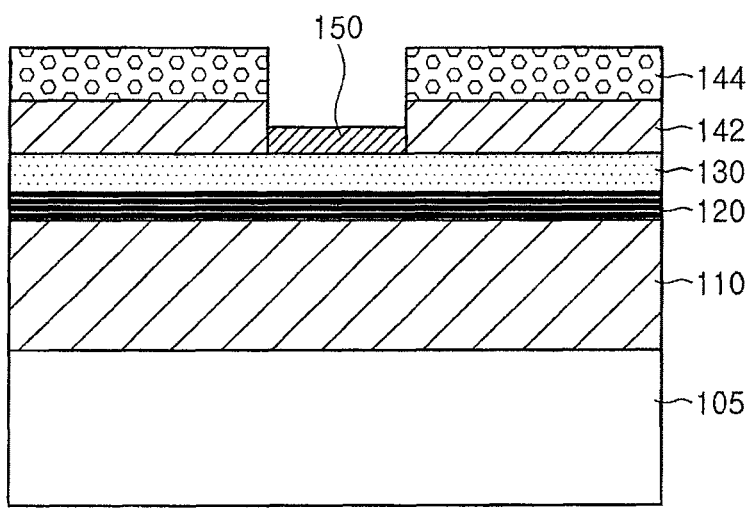

Next, referring to FIG. 4, the first pattern 210 is removed to expose the second region, and the current blocking layer 150 is formed on the second conductive type semiconductor layer 130 in the exposed second region. The current blocking layer 150 may also be formed of a non-ohmic metal. For example, the current blocking layer 150 may be formed of at least one of titanium (Ti), zirconium (Zr), chrome (Cr), gold (Au), and/or tungsten (W) as a metal in Schottky contact with the second conductive type semiconductor layer 130 in the exposed second region. The current blocking layer 150 may also include various metals including a non-ohmic metal with aluminum (Al) on the second conductive type semiconductor layer 130.

In the light emitting device according to the current embodiment and the method of manufacturing the light emitting device, the process of forming the current blocking layer is separated from a heat treating process of the ohmic layer and the reflective layer to form a current blocking layer that is not affected by the heat treating process and material diffusion of the reflective layer, thus providing a light emitting device having high light emitting efficiency.

Figure 5:
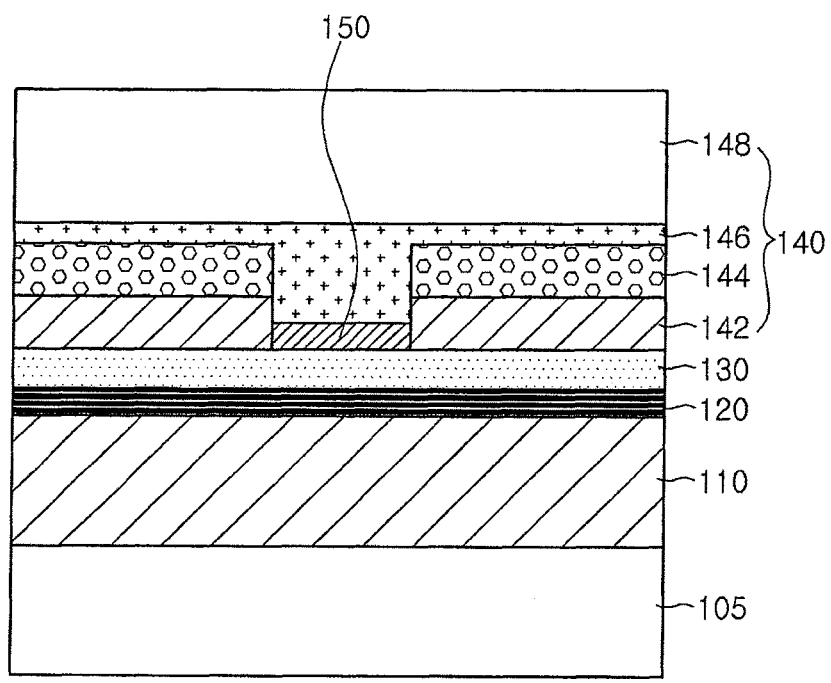

Thereafter, as shown in FIG. 5, the adhesive layer 146 is formed on the reflective layer 144 and the current blocking layer 150, but the forming of the adhesive layer 146 is not always needed. That is, the reflective layer 144 may function as an adhesive layer, and the forming of the adhesive layer 146 may be removed.

Thereafter, the second substrate 148 is formed on the adhesive layer 146. Then, when the first conductive type semiconductor layer 110 has a sufficient thickness of about 50 µm or greater, the forming of the second substrate 148 is removed. The second substrate 148 may be formed of one of a metal, a metal alloy, and/or a conductive semiconductor material, which have high electrical conductivity, to efficiently inject holes to the second substrate 148. For example, the second substrate 148 may be formed of copper (Cu), copper alloy (CuAlloy), Si, Mo, or SiGe. A method of forming the second substrate 148 may also be an electrochemical metal deposition method or a bonding method using eutectic metal.

Figure 6:
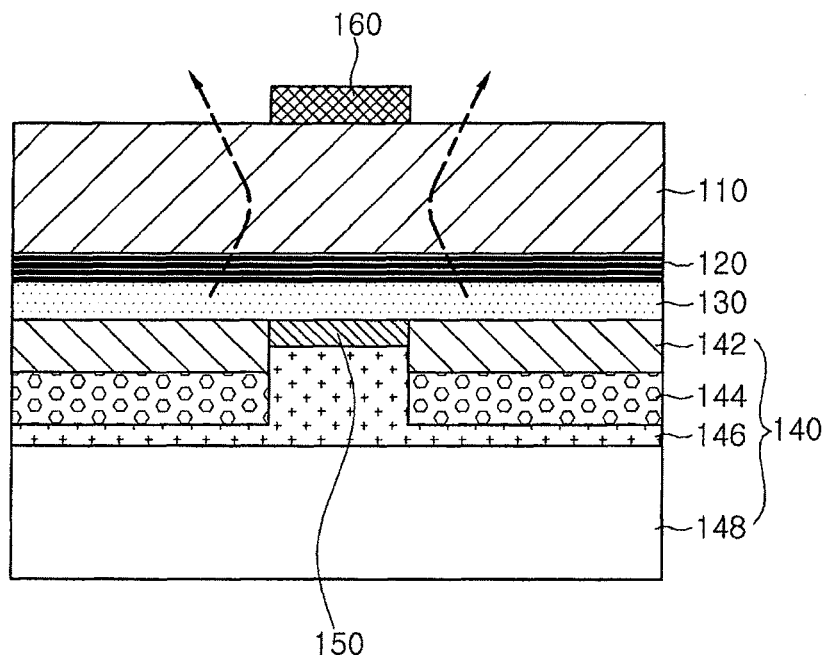

Next, referring to FIG. 6, the first substrate 105 is removed to expose the first conductive type semiconductor layer 110. In more detail, to remove the first substrate 105, a high power laser or a chemical etching method may be used. In addition, the first substrate 105 may be physically ground to remove the first substrate 105. Thereafter, the un-doped GaN layer and the buffer layer may be removed if they are present. The first electrode 160 is then formed on the first conductive type semiconductor layer 110. For example, the first electrode 160 may be formed of at least one of titanium (Ti), chrome (Cr), nickel (Ni), aluminum (Al), platinum (Pt), and/or gold (Au).

In addition, the first electrode 160 is formed on the first conductive type semiconductor layer 110, and may have at least one portion that vertically overlapping the current blocking layer 150. Accordingly, a current flowing to the first electrode 160 substantially does not flow through the region where the current blocking layer 150 is disposed, and flows through the region out of the current blocking layer 150.

Accordingly, in the current embodiment, a current is substantially not injected to the lower side of the region of the first electrode 160 to suppress the generation of light from the active layer 120 under the first electrode 160, thus preventing heat from being generated from the device by the absorption of light generated under the first electrode 160.

Second Embodiment

Hereinafter, a method of manufacturing a light emitting device according to the second embodiment will now be described with reference to FIGS. 7 to 10. The second embodiment may adopt some of the technical features of the first embodiment, and thus the differences between the embodiments will be principally described.

Figure 7:
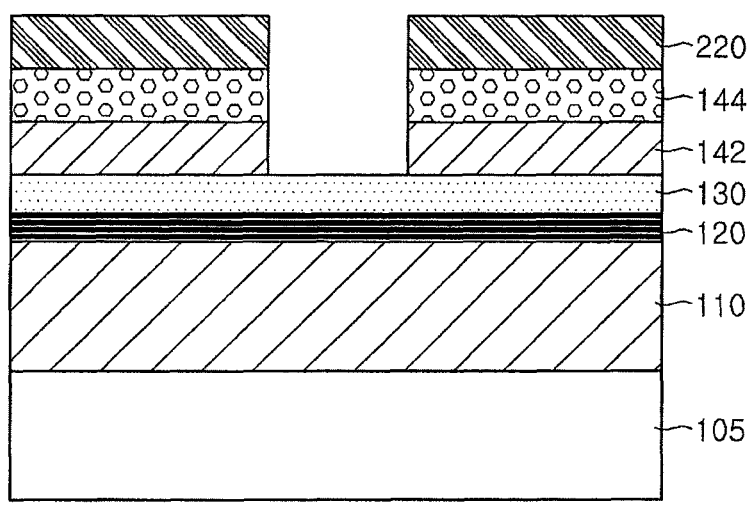
FIGS. 7 to 10 are cross-sectional views illustrating a method of manufacturing a light emitting device according to a second embodiment of the present invention.

Referring to FIG. 7, an un-doped GaN layer, the first conductive type semiconductor layer 110, the active layer 120, and the second conductive type semiconductor layer 130 are formed on the first substrate 105. A buffer layer may also be formed between the first substrate 105 and the un-doped GaN layer. Thereafter, the ohmic layer 142 and the reflective layer 144 are formed on the second conductive type semiconductor layer 130.

A second pattern 220 is then formed on the first region of the reflective layer 144. The second pattern 220 may be formed as a layer such as a dielectric or a photosensitive layer. Thereafter, the ohmic layer 142 and the reflective layer 144 in the second region are removed using the second pattern 220 as a mask, so as to partially expose the second conductive type semiconductor layer 130. The second region may also vertically correspond to the region where the first electrode 160 will be formed later.

Figure 8:
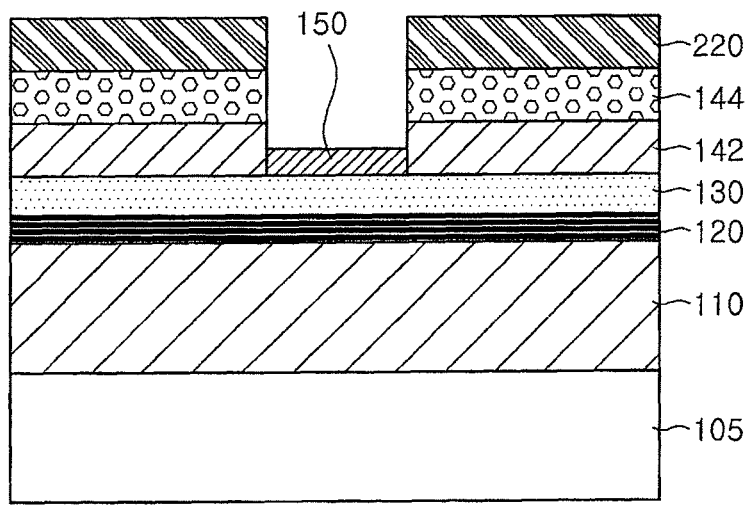

Next, referring to FIG. 8, the current blocking layer 150 is formed on the second conductive type semiconductor layer 130 exposed in the second region. For example, the current blocking layer 150 may be formed of at least one of titanium (Ti), zirconium (Zr), chrome (Cr), gold (Au), and/or tungsten (W) as a metal in Schottky contact with the second conductive type semiconductor layer 130 in the exposed second region.

In the light emitting device according to the current embodiment and the method of manufacturing the light emitting device, the process of forming the current blocking layer is separated from a heat treating process of the ohmic layer and the reflective layer to form a current blocking layer that is not affected by the heat treating process and material diffusion of the reflective layer, thus providing a light emitting device having high light emitting efficiency.

Figure 9:
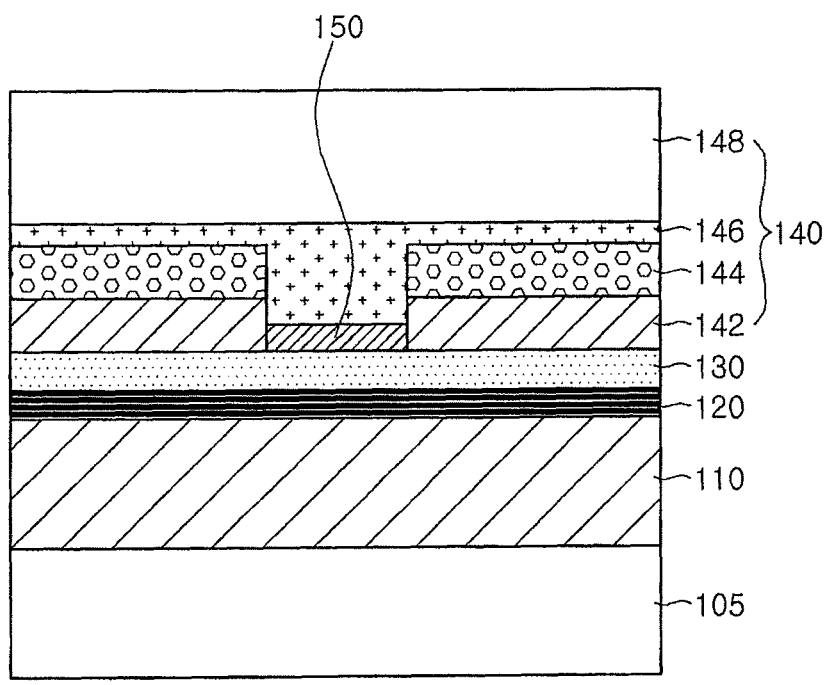
Figure 10:
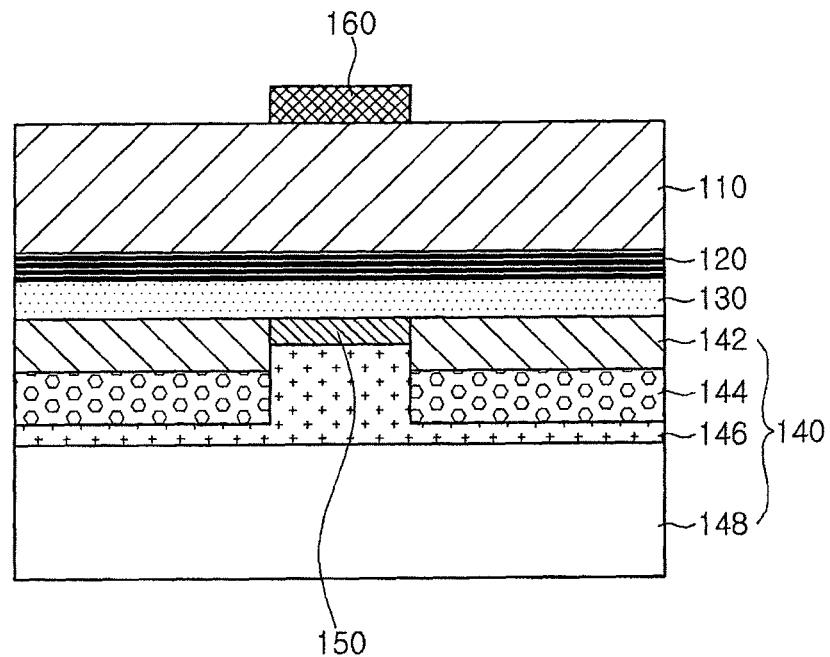

Next, referring to FIG. 9, the second pattern 220 is removed, and the adhesive layer 146 may be formed on the reflective layer 144 and the current blocking layer 150. Thereafter, the second substrate 148 is formed on the adhesive layer 146. Next, referring to FIG. 10, the first substrate 105 and the un-doped GaN layer are removed to expose the first conductive type semiconductor layer 110. The buffer layer is also removed if it is present. Thereafter, the first electrode 160 is formed on the first conductive type semiconductor layer 110. The first electrode 160 may have at least one portion that vertically overlapping the current blocking layer 150.

Accordingly, in the current embodiment, a current is substantially not injected to the lower side of the region of the first electrode 160 to suppress the generation of light from the active layer 120 under the first electrode 160, thus preventing heat from being generated from a device by the absorption of light generated under the first electrode 160.

In the light emitting device according to the current embodiment and the method of manufacturing the light emitting device, the process of forming the current blocking layer is separated from a heat treating process of the ohmic layer and the reflective layer to form a current blocking layer that is not affected by the heat treating process and material diffusion of the reflective layer, thus providing a light emitting device having high light emitting efficiency.

Figure 11:
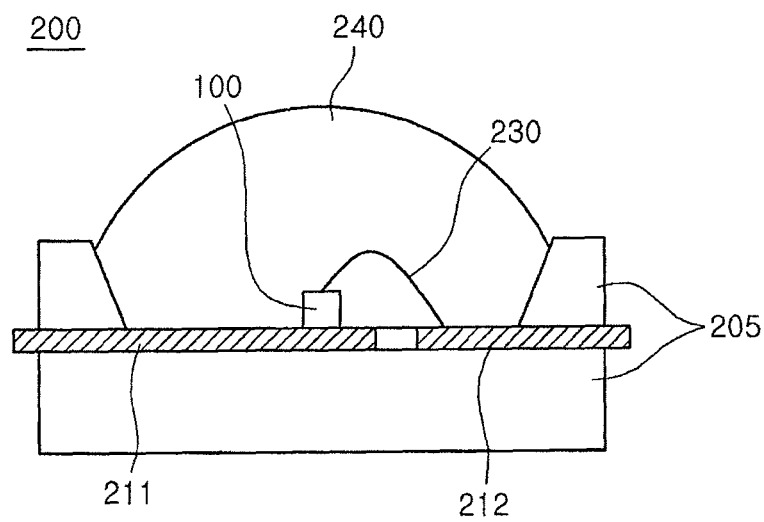
FIG. 11 is a cross-sectional view of an LED package including an LED according to an embodiment of the present invention.

Next, FIG. 11 is a cross-sectional view of an LED package 200 including the LED 100 according to an embodiment of the present invention. Referring to FIG. 11, the LED package 200 includes a body 205, a third electrode layer 211 and a fourth electrode layer 212 disposed in the body 205, the LED 100 disposed in the body 205 and electrically connected to the third electrode layer 211 and the fourth electrode layer 212, and a molding member 240 surrounding the LED 100.

Further, the body 205 may be formed of a silicon material, a synthetic resin material, or a metal material. An inclined surface may also be disposed around the LED 100. In addition, the third electrode layer 211 and the fourth electrode layer 212 are electrically separated from each other and supply a power to the LED 100. Also, the third electrode layer 211 and the fourth electrode layer 212 reflect light generated in the LED 100 to improve light efficiency in the package.

In addition, the third electrode layer 211 and the fourth electrode layer 212 release heat generated in the LED 100 to the outside. Further, the vertical type LED illustrated in FIG. 1 may be applicable as the LED 100, but is not limited thereto. For example, a lateral type LED may be applicable as the LED 100.

In addition, the LED 100 may be disposed on the body 205 or on the third electrode layer 211 or the fourth electrode layer 212. The LED 100 may also be electrically connected to the third electrode layer 211 and/or the fourth electrode layer 212 through a wire 230. In this embodiment, the vertical type LED 100 is explained as an example, and one wire 230 may be used as an example, but is not limited thereto.

The molding member 240 also surrounds the LED 100 to protect the LED 100. Also, a phosphor may be contained in the molding member 240 to vary a wavelength of light emitted from the LED 100.

In addition, the LED package according to an embodiment may be applicable to a lighting system. The lighting system may include a lighting unit illustrated in FIG. 12 and a backlight unit illustrated in FIG. 13. In addition, the lighting system may include traffic lights, a vehicle headlight, and a sign.

Figure 12:
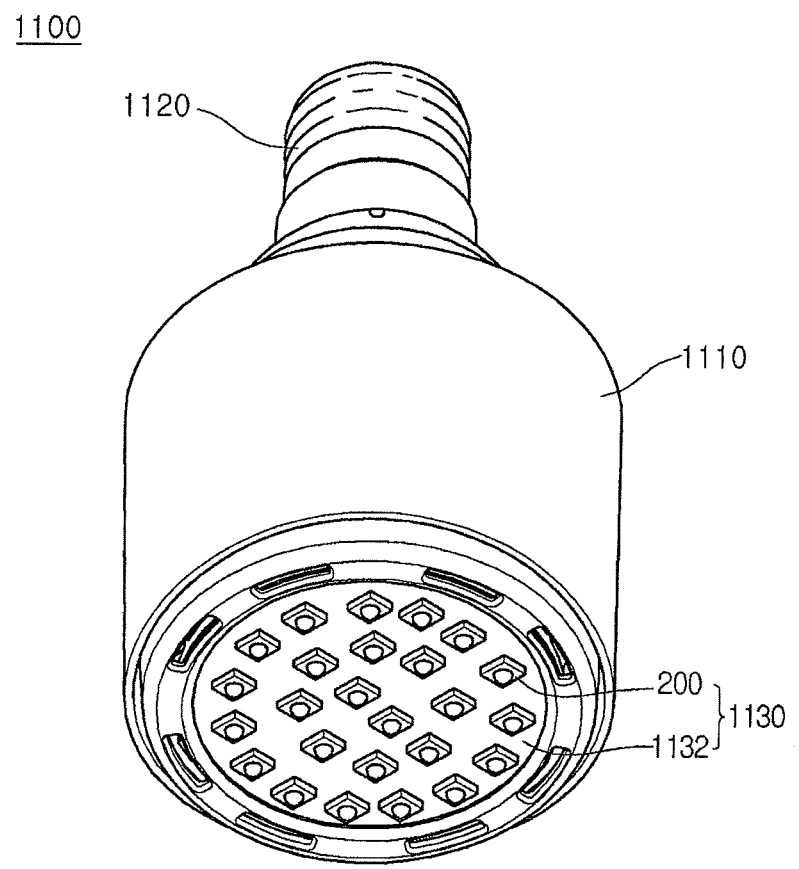
FIG. 12 is a perspective view of a lighting unit according to an embodiment of the present invention.

In more detail, FIG. 12 is a perspective view of a lighting unit 1100 according to an embodiment of the present invention. Referring to FIG. 12, the lighting unit 1100 includes a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material. In addition, the light emitting module 1130 includes a substrate 1132 and at least one light emitting device package 200 mounted on the substrate 1132.

A circuit pattern may also be printed on an insulation material to form the substrate 1132. For example, the substrate 1132 may include a printed circuit board (PCB), a metal core PCB, a flexible PCB, or a ceramic PCB. Also, the substrate 1132 may be formed of a material that can effectively reflect light. A surface of the substrate 1132 may also be coated with a colored material, e.g., a white or silver-colored material by which light is effectively reflected.

In addition, the light emitting device package 200 may be mounted on the substrate 1132 and include at least one light emitting diode 100. The light emitting diode 100 may also include a colored light emitting diode that emits red, green, blue, or white light, and an UV light emitting diode that emits ultraviolet (UV) light.

Further, the light emitting module 1130 may include a plurality of light emitting device packages 200 to obtain various colors and brightness. For example, a white LED, a red LED, and a green LED may be disposed in combination with each other to secure a high color rendering index (CRI).

The connection terminal 1120 may also be electrically connected to the light emitting module 1130 to supply a power. As shown in FIG. 12, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 13:
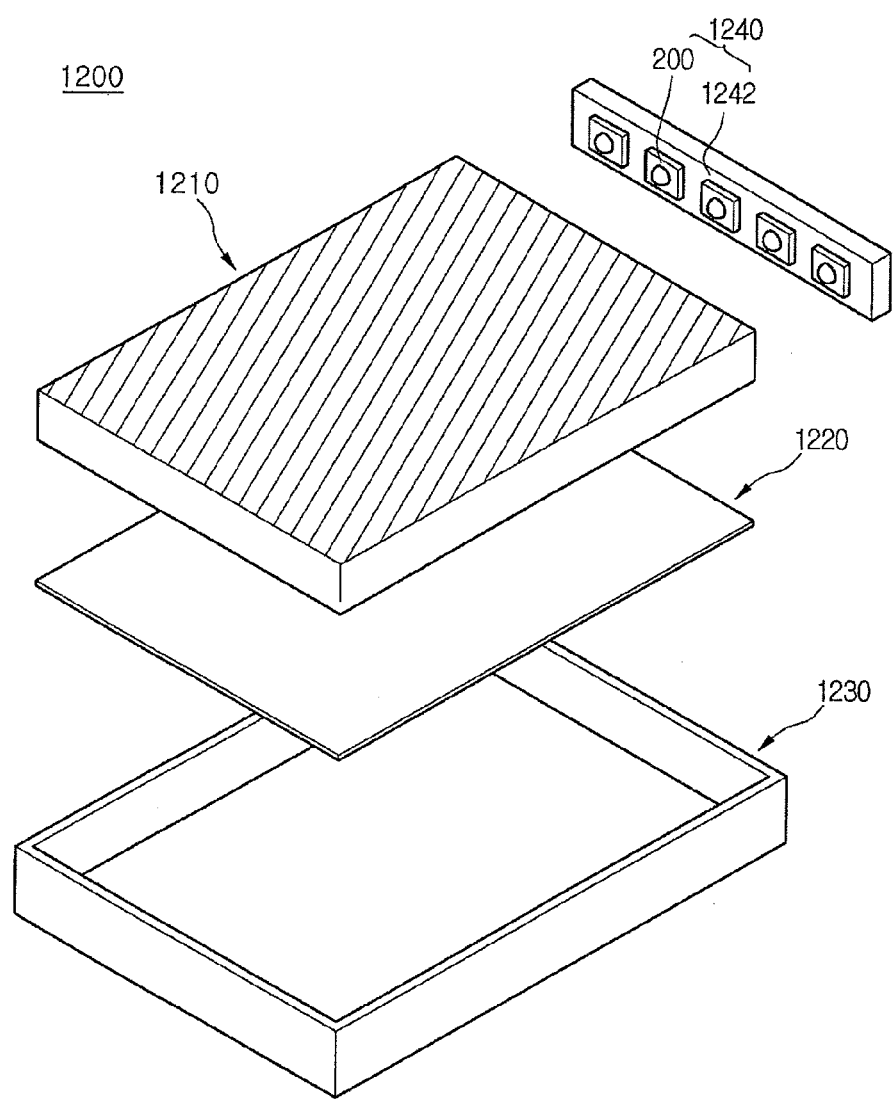
FIG. 13 is an exploded perspective view of a backlight unit according to an embodiment of the present invention.

Next, FIG. 13 is an exploded perspective view of a backlight unit 1200 according to an embodiment of the present invention. As shown, the backlight unit 1200 includes a light guide plate 1210, a light emitting module 1240, a reflective member 1220, and a bottom cover 1230, but is not limited thereto. The light emitting module 1240 also provides light to the light guide plate 1210. Further, the reflective member 1220 may be disposed below the light guide plate 1210. The bottom cover 1230 may also receive the light guide plate 1210, the light emitting module 1240, and the reflective member 1220.

In addition, the light guide plate 1210 diffuses light to produce planar light. Further, the light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and/or a polyethylene naphthalate (PEN) resin.

In addition, the light emitting module 1240 provides light to at least one surface of the light guide plate 1210. Thus, the light emitting module 1240 may be used as a light source of a display device including the backlight unit. The light emitting module 1240 may also contact the light guide plate 1210, but is not limited thereto. In particular, the light emitting module 1240 includes a substrate 1242 and a plurality of light emitting device packages 200 mounted on the substrate 1242. The substrate 1242 may also contact the light guide plate 1210, but is not limited thereto.

Further, the substrate 1242 may be a PCB including a circuit pattern. However, the substrate 1242 may include a metal core PCB or a flexible PCB as well as the PCB, but is not limited thereto. Also, a light emitting surface of each of the plurality of light emitting device packages 200 may be spaced a predetermined distance from the light guide plate 1210.

Further, the reflective member 1220 may be disposed below the light guide plate 1210. The reflective member 1220 also reflects light incident onto a bottom surface of the light guide plate 1210 to proceed in an upward direction, thereby improving brightness of the backlight unit. For example, the reflective member may be formed of one of PET, PC, and PVC, but is not limited thereto.

In addition, the bottom cover 1230 may receive the light guide plate 1210, the light emitting module 1240, and the reflective member 1220. For this, the bottom cover 1230 may have a box shape with an open upper side, but is not limited thereto. The bottom cover 1230 may also be formed of a metal material or a resin material. Also, the bottom cover 1230 may be manufactured using a press forming process or an extrusion molding process.

Thus, in embodiments of the present invention, the current blocking layer includes metal rather than a dielectric or a non-ohmic metal to block a current. Further, the current blocking layer is not transformed into a layer to which a current can be injected through a heat treating process to form an ohmic layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a metal layer;
an adhesive layer on the metal layer;
a light emitting structure on the adhesive layer;
at least one first electrode on the light emitting structure;
a reflective layer between the adhesive layer and the light emitting structure;
a contact layer between the adhesive layer and the light emitting structure; and
a schottky contact layer between at least one area of the adhesive layer and the light emitting structure,
wherein the adhesive layer has a protrusion portion, and
wherein the protrusion portion vertically overlaps with the schottky contact layer.

2. The light emitting device of claim 1, wherein a material of the schottky contact layer is different from a material of the reflective layer.

3. The light emitting device of claim 1, wherein the schottky contact layer vertically overlaps with at least one portion of the at least one first electrode.

4. The light emitting device of claim 1, wherein the at least one first electrode does not vertically overlap with at least one portion of the contact layer.

5. The light emitting device of claim 1, wherein a material of the contact layer is different from a material of the reflective layer.

6. The light emitting device of claim 1, wherein the adhesive layer has a protrusion portion, and
wherein the protrusion portion vertically overlaps with both the schottky contact layer and the at least one first electrode.

7. The light emitting device of claim 1, wherein a thickness of the contact layer is thinner than that of the reflective layer.

8. The light emitting device of claim 1, wherein the light emitting structure comprises a first region and a second region,
wherein the metal layer and the reflective layer are disposed under the light emitting structure at the first region of the light emitting structure, and
wherein the schottky contact layer is disposed under the light emitting structure only at the second region of the light emitting structure.

9. The light emitting device of claim 1, wherein the schottky contact layer does not overlap with the reflective layer.

10. The light emitting device of claim 1, wherein a top surface of the schottky contact layer is flush with a top surface of the reflective layer.

11. The light emitting device of claim 1, wherein both of the reflective layer and the schottky contact layer are directly in contact with the light emitting structure.

12. The light emitting device of claim 1, wherein a conductivity of the schottky contact layer is less than that of the reflective layer.

* * * * *